(12) United States Patent
Mukherjee et al.

(10) Patent No.: US 7,817,394 B2
(45) Date of Patent: Oct. 19, 2010

(54) SYSTEMS, APPARATUS AND METHODS CAPABLE OF SHELF MANAGEMENT

(75) Inventors: Udayan Mukherjee, Portland, OR (US); Chetan Hiremath, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1010 days.

(21) Appl. No.: 10/900,927

(22) Filed: Jul. 28, 2004

(65) Prior Publication Data

US 2006/0023384 A1 Feb. 2, 2006

(51) Int. Cl.
*H02H 5/04* (2006.01)

(52) U.S. Cl. .................. 361/103; 700/22; 710/100; 710/305; 717/121

(58) Field of Classification Search ............. 700/22; 361/103; 717/121; 710/100, 305

See application file for complete search history.

(56) References Cited

U.S. PATENT DOCUMENTS

| | | | | |
|---|---|---|---|---|
| 5,581,600 | A * | 12/1996 | Watts et al. | 379/88.02 |
| 6,363,449 | B1 * | 3/2002 | Sides et al. | 710/100 |
| 7,188,335 | B1 * | 3/2007 | Darr et al. | 717/121 |
| 2002/0194415 | A1 * | 12/2002 | Lindsay et al. | 710/305 |
| 2004/0221084 | A1 * | 11/2004 | Yates et al. | 710/305 |
| 2005/0160187 | A1 * | 7/2005 | Byers et al. | 710/1 |

OTHER PUBLICATIONS

Remote boundary-scan system test control for the ATCA standard Backstrom, D.; Carlsson, G.; Larsson, E.; Test Conference, 2005. Proceedings. ITC 2005. IEEE International Nov. 8-10, 2005 pp. 10 pp.*
"-IPMI- Intelligent Platform Management Bus Communications Protocol Specification V1.0", *Table of Contents*, Document Revision 1.0,(Nov. 15, 1999),3 pgs.
"-IPMI- Intelligent Platform Management Interface Specification Second Generation V2.0", *Table of Contents*, Document Revision 1.0,(Feb. 12, 2004),23 pgs.
"Advanced Mezzanine Card Short Form Specification", *PICMG AMC.0*, (Jun. 15, 2004),58 pgs.
"Advanced TCA, PICMG 3.0 Short Form Specification", *PCI Industrial Computers Manufacturers Group (PICMG)*, (Jan. 2003),34 pages.
"The I2C-Bus Specification, Version 2.1", *Table of Contents*, Document Order No. 9398 393 40011,(Jan. 2000),2 pgs.

\* cited by examiner

*Primary Examiner*—Albert DeCady
*Assistant Examiner*—Tejal J Gami
(74) *Attorney, Agent, or Firm*—Grossman, Tucker, Perreault & Pfleger, PLLC

(57) ABSTRACT

A method according to one embodiment may include discovering, by software, at least one variable from at least one component populated on a shelf system. The method may also include performing, by the software, at least one shelf management function based on at least one variable. Of course, many alternatives, variations, and modifications are possible without departing from this embodiment.

26 Claims, 6 Drawing Sheets

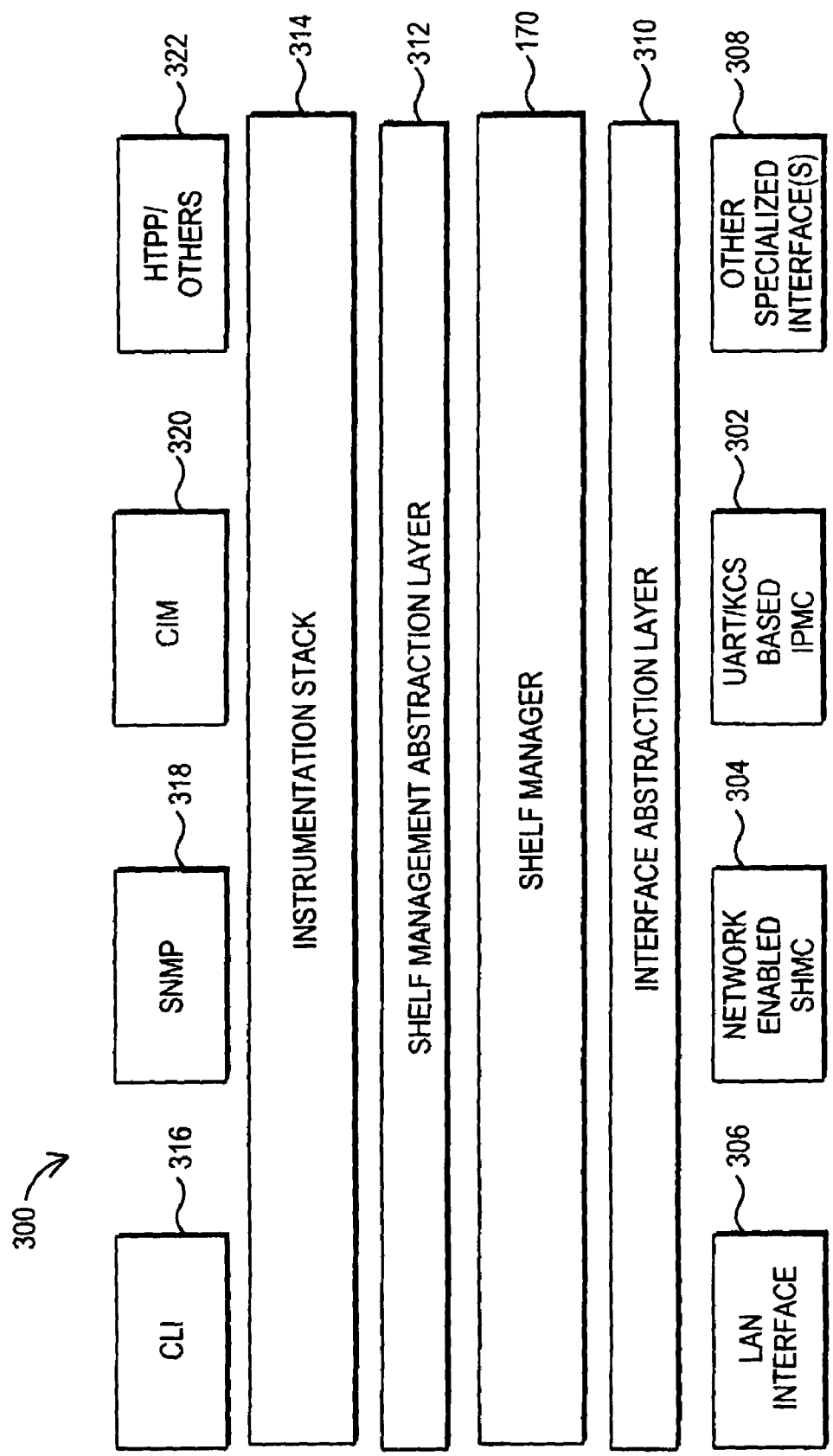

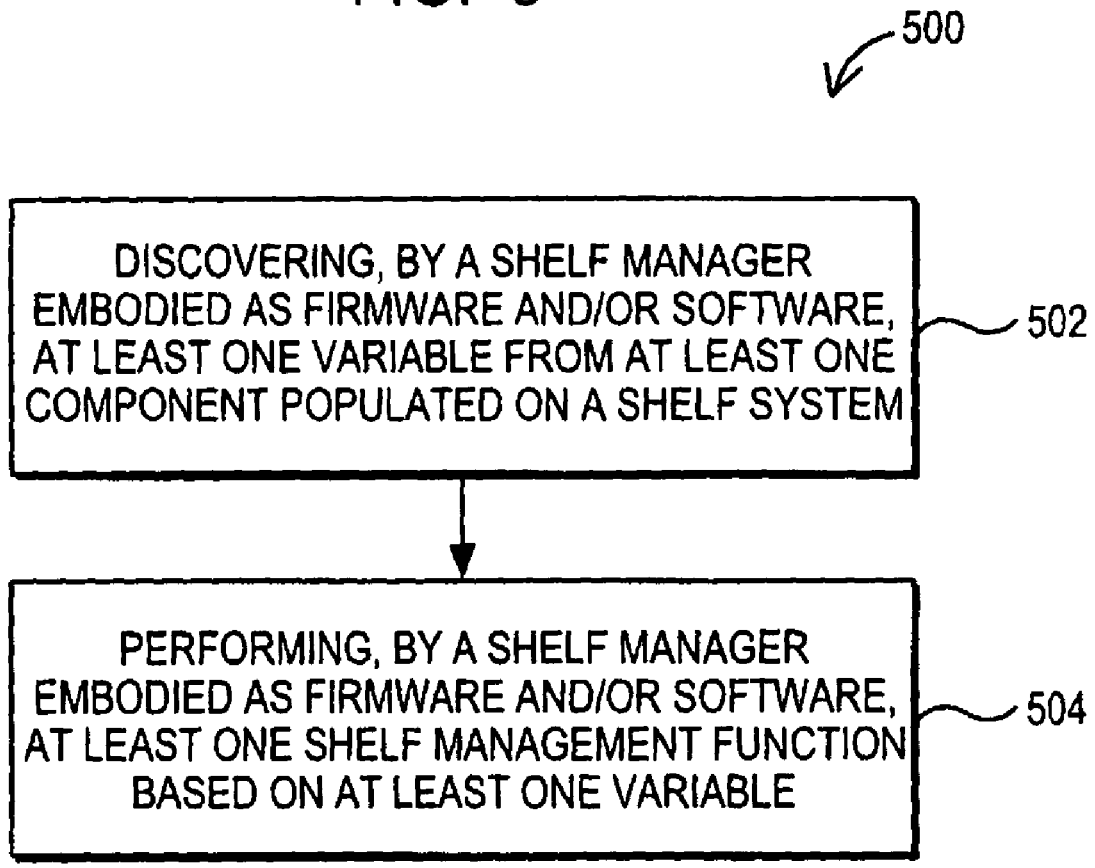

SYSTEMS, APPARATUS AND METHODS CAPABLE OF SHELF MANAGEMENT

FIELD

This disclosure relates to systems, apparatus and methods capable of shelf management.

BACKGROUND

Hardware platform architectures require a set of manageability features in order to monitor and manage an associated system. Manageability features may include, for example, negotiating power budgets between circuit boards of the system, monitoring and controlling cooling, hot-swap management and other capabilities that may be related to security.

Dedicated hardware solutions exist to perform manageability features. However, such dedicated hardware solutions may be designed only for a particular system, and may lack flexibility to be readily incorporated into different systems. For example, one dedicated hardware solution for a particular sized chassis may require significant reengineering to fit the hardware in a different sized chassis. This reengineering may include determining where to best locate the hardware and performing thermal validation, and it may take considerable time and expense. In some situations, dedicated hardware solutions may not even be able to be situated in a new environment, e.g., base stations, node-b, and other edge segments, despite significant reengineering given size/form factor and other constraints of the new environment.

In addition, conventional hardware solutions require space in an environment where there is a premium on space. Furthermore, conventional hardware solutions may contribute to a significant consumption of power in an environment where there is also a premium on power consumption. Such power consumption, partly attributable to cooling of the hardware, may detract from allowable power consumption of other components. Furthermore, conventional hardware solutions may lack flexibility to communicate with a plurality of devices using a plurality of communication protocols.

BRIEF DESCRIPTION OF THE DRAWINGS

Features and advantages of embodiments of the claimed subject matter will become apparent as the following Detailed Description proceeds, and upon reference to the Drawings, where like numerals depict like parts, and in which:

FIG. 3 is a block diagram of an exemplary architecture of the shelf manager of FIGS. 2A and 2B;

FIG. 5 depicts a flowchart of exemplary operations which may be performed according to an embodiment.

Although the following Detailed Description will proceed with reference being made to illustrative embodiments, many alternatives, modifications, and variations thereof will be apparent to those skilled in the art. Accordingly, it is intended that the claimed subject matter be viewed broadly.

DETAILED DESCRIPTION

Figure 1:
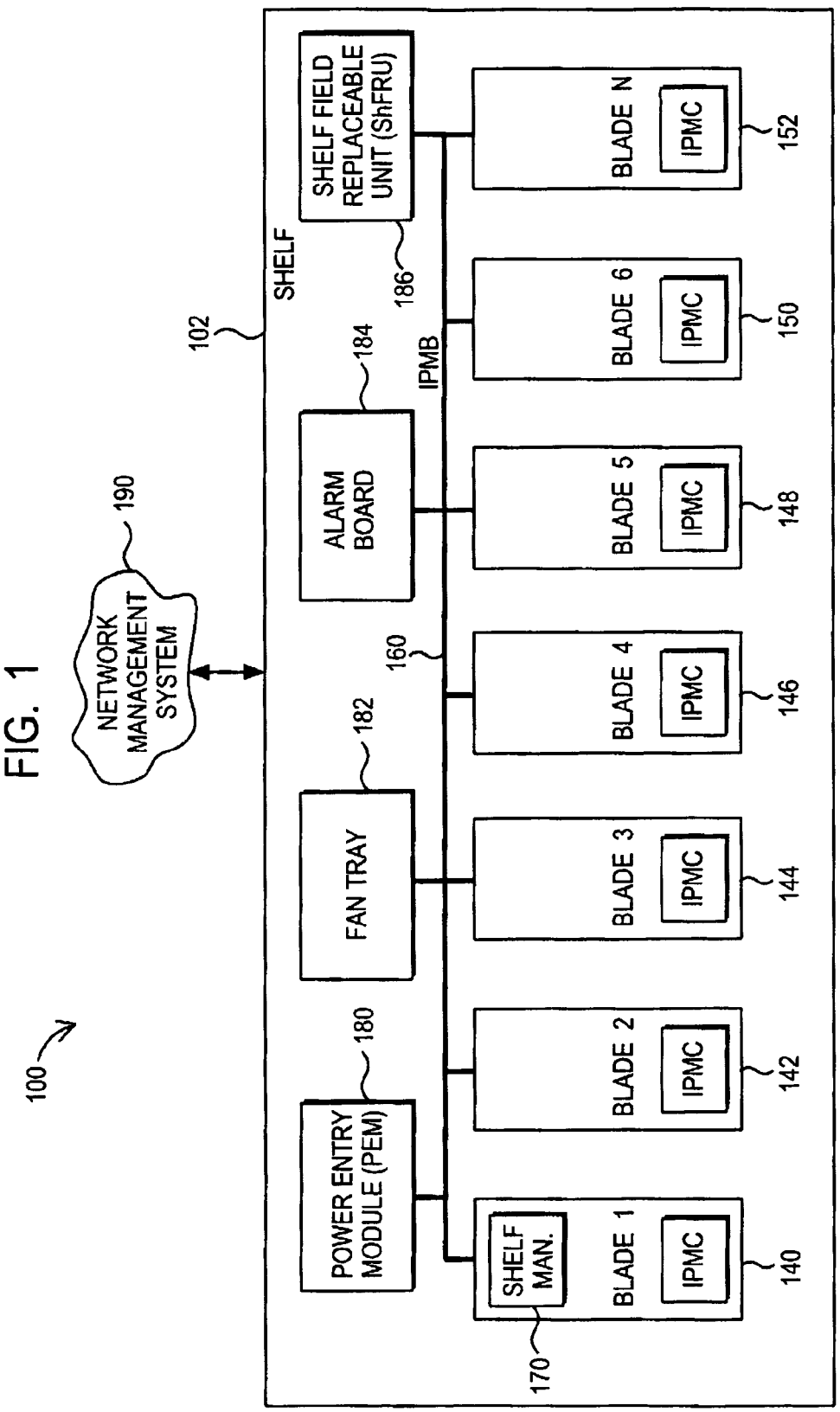
FIG. 1 is a block diagram of an exemplary shelf system according to an embodiment.

Turning to FIG. 1, a shelf system 100 embodiment 100 of the claimed subject matter is illustrated. The system 100 may include a shelf 102 having a plurality of circuit boards 140, 142, 144, 146, 148, 150, 152 that may populate the shelf 102. To that end, and although not shown in FIG. 1, shelf 102 may include a plurality of slots and each circuit card may include of contacts capable of electrical and mechanical mating with a slot (slots) disposed on shelf 102. Circuit boards may be referred to herein as "blades", (e.g., Blade 1, Blade 2, . . . , Blade N) and such terms may be used interchangeably. A plurality of shelf systems may be coupled together in a rack, for example in an enterprise or telecommunication environment. Although one shelf 102 is depicted in the system 100 of FIG. 1, system 100 may also include a plurality of shelves without departing from this embodiment. The system 100 may form part of a telecommunications office equivalent to a data center chassis.

Each circuit board may include an Intelligent Platform Management Controller (IPMC) that complies or is compatible with the Intelligent Platform Management Interface (IPMI) Standard detailed in "Intelligent Platform Management Interface Specification Second Generation," Document Revision 1.0, dated Feb. 12, 2004, published by Intel, Hewlett-Packard, NEC, and Dell. Although nor shown in the figures, one or more circuit cards populated on shelf 102 may include a network interface to permit communication between a circuit card and one or more components external to shelf 102. To that end, a communications interface may comply or be compatible with an Internet Protocol (IP) based communication protocol and/or other communication protocols.

Circuit boards 140, 142, 144, 146, 148, 150, 152, populated on shelf 102 may comply or be compatible with the ATCA Specification as may be defined in the Advanced Telecommunications Computing Architecture (ATCA) PCI Industrial Computer Manufacturers Group (PICMG) 3.0 Specification, Version 9.0, dated Nov. 11, 2002, and/or later versions of the specification (the "ATCA Specification") and/or the ATCA PICMG 3.0 Short Form Specification published on Jan. 30, 2003.

The shelf 102 may also include a power entry module 180 capable of providing power to the shelf 102, a fan 182 which may be capable of providing cooling of one or more physical devices (e.g. components) populated on shelf 102, an alarm board 184 which may be capable of providing visual notification of fault conditions, and a shelf field replaceable unit (ShFRU) 186. The shelf 102 may also include an Intelligent Platform Management Bus (IPMB) 160, which may be capable of providing out of band communication between circuit boards and/or other components populated on shelf 102. IPMB 160 may comply or be compatible with the "Intelligent Platform Management Bus Communications Protocol Specification," Document Revision 1.0, dated Nov. 15, 1999, published by Intel, Hewlett-Packard, NEC, and Dell and/or later versions of this standard. The IPMB Standard specifies the architecture and protocol used to interconnect IPMCs and other components via an I²C based serial bus for the purpose of platform management. Details on the I²C-bus are detailed in "The I²C-BUS SPECIFICATION," Version 2.1, dated January 2000, published by Phillips Semiconductors. The shelf 102 may also include other types of out of band management communication protocols, for example, serial communication protocols (e.g.,UART) and/or other communication protocols.

System 100 may also comprise a network management system 190. Network management system 190 may enable a remote management client (not shown) to remotely manage the system 100. To that end, shelf 102 may also include a network communication interface (not shown) to permit a remote management client to exchange commands and data with all or part of shelf 102.

The system 100 may also have a shelf manager 170 to perform manageability functions for the shelf 102. In this embodiment, the shelf manager 170 may be implemented in software or firmware, or a combination of both. As will be detailed further herein, shelf manager 170 may be capable performing one or more manageability functions with respect to one or more components populated on shelf 102. A "component", as used herein, may include one or more elements and/or functional blocks of shelf 102 (e.g., circuit cards 140-152, power entry module 180, fan tray 182, alarm board 184 and/or ShFRU 186 and/or other resources and/or functionality of the shelf that are shared between all or a subset of the circuit (for example, fans may be a shared resource which may be operable to cool all the boards), and/or subsets or collections thereof, and/or other elements not depicted in FIG. 1. The shelf manager 170, in this embodiment, may reside on circuit board 140, although it is equally contemplated herein that the shelf manager 170 may be location independent, and may therefore be located in other circuit boards and/or other components populated on shelf 102, or may be a separate component populated on shelf 102. For example, the shelf manager 170 may alternatively reside in one or more integrated circuits of the shelf 102, any other circuit board 142, 144, 146, 148, 150, 152, or external to the shelf 102. Thus, for example, shelf manager 170 may be integrated into the IPMC controller and/or other chipset (e.g., network interface controller and/or network communications controller). Shelf manager 170 may be capable of communicating with one or more IPMCs comprised in one or more circuit boards 142, 144, 146, 148, 150, 152, via the IPMB 160.

Shelf manager 170 may be capable of discovering one or more variables from one or more components populated on a shelf system (such as shelf 102). Shelf manager 170 may also be capable of performing one or more shelf management operations based on one or more variables. Exemplary management functions may include, for example, negotiating power budgets among a plurality of components, monitoring and controlling cooling, and/or establishing security and/or hot-swap management. Management functions and operability, as used herein, may comply or be compatible with management functions promulgated by the aforementioned ATCA standards. Further, manageability functions may be extended to include management of other systems and platforms, for example, platforms for servers, desktop computers, and handheld computers.

Figure 2A:
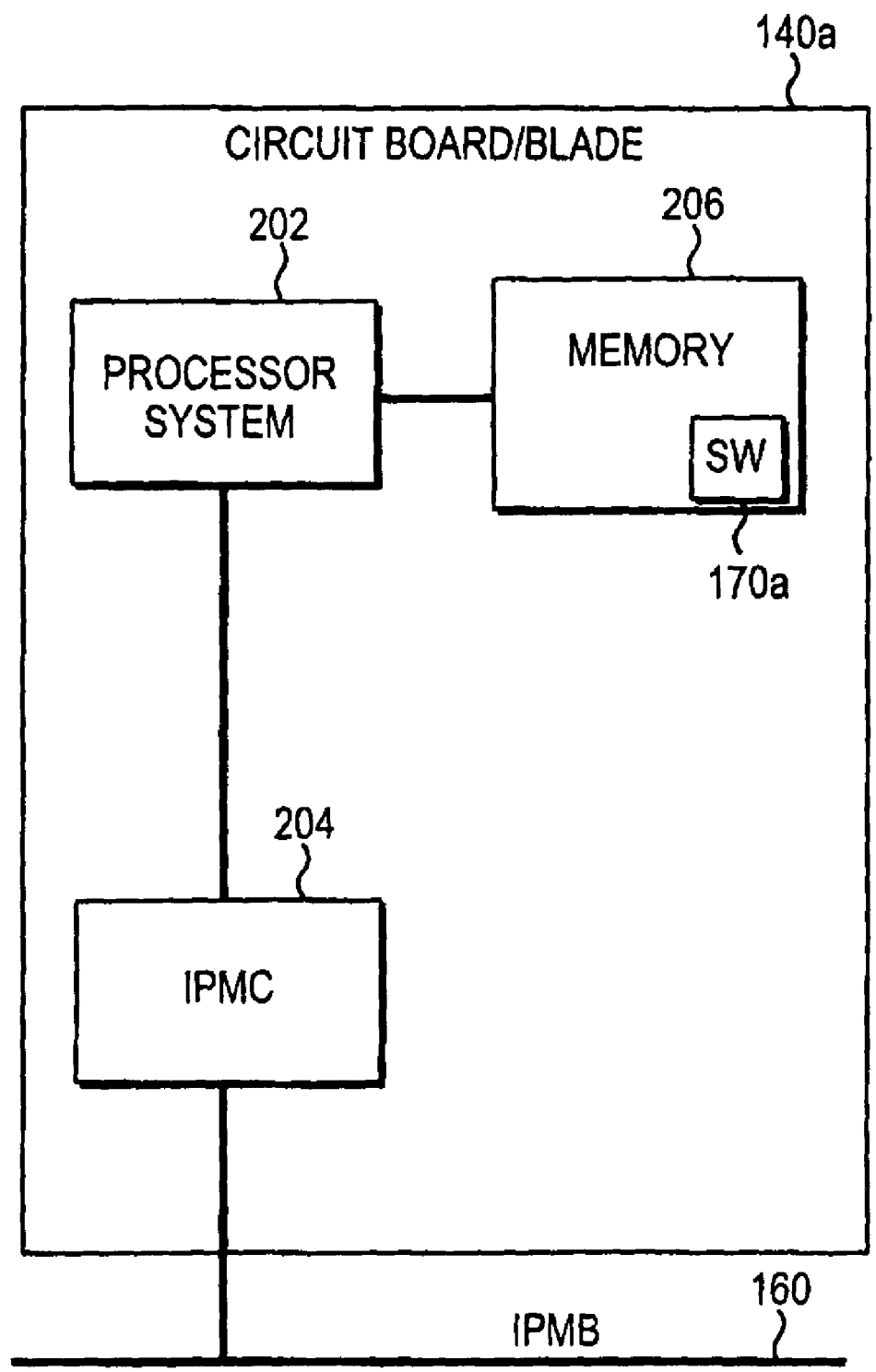
FIG. 2A is a block diagram a circuit board of the system of FIG. 1 illustrating an exemplary software shelf manager.

As stated, the shelf manager 170 may be implemented in software, firmware, or a combination thereof to provide manageability functions for the shelf 102. "Software", as used in any embodiment herein, may comprise one or more instructions which may be executed by a machine. FIG. 2A is a block diagram of an ATCA circuit board 140a, and in this embodiment software 170a may be included to provide manageability functions. The ATCA circuit board 140a of FIG. 2A may include a processor system 202, an IPMC 204, and memory 206. The IPMC 204 may be coupled to IPMB 160 and may be capable of monitoring one or more conditions related to manageability functions such as temperature, power consumption, and reset controls for a particular circuit board. The processor system 202 may be capable, at least in part, of executing one or more management instructions, as may be included in software 170a. Processor system 202 may comprise one or more custom and/or off-the-shelf processors, for example, one or more IA or IXA processor subsystems commercially available from the Assignee of the subject application.

Memory 206 may include machine readable storage media such as random-access memory (RAM), dynamic RAM (DRAM), static RAM (SRAM), and/or any other media capable of storing information. Processor system 202 may access software 170a stored in memory 206 to perform manageability functions. Circuit board 140a may also include IPMC 204 circuitry that complies or is compatible with the IPMI Standard. The IPMC 204 may be capable of exchanging commands and data between the processor 202 and the IPMB 160.

Figure 2B:
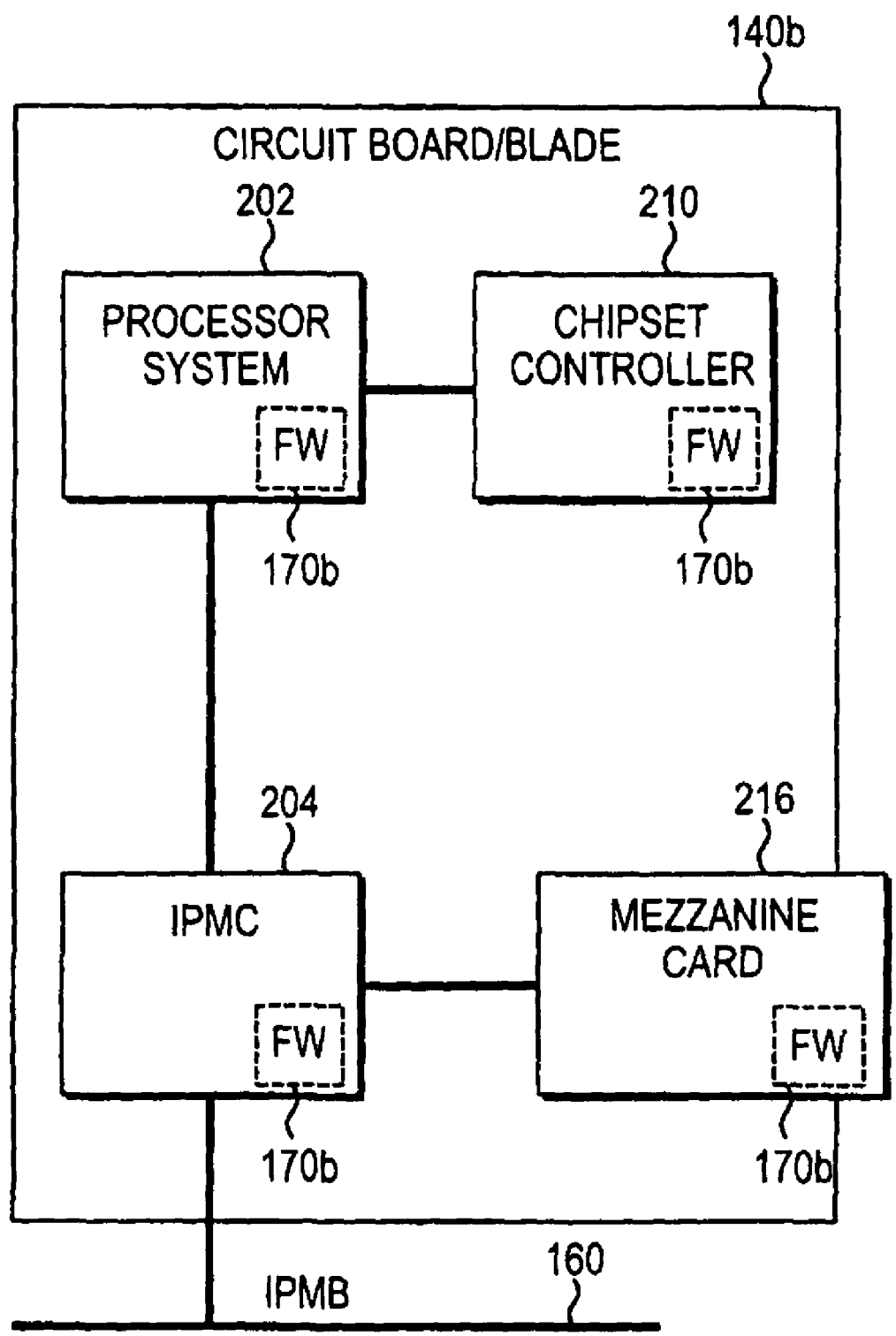
FIG. 2B is a block diagram of a circuit board of the system of FIG. 1 illustrating an exemplary firmware shelf manager.

FIG. 2B illustrates a circuit board 140b having a shelf manger 170b implemented in firmware. "Firmware", as used in any embodiment herein may, comprise circuitry capable of executing one or more instructions. Shelf manager 170b may be capable of providing manageability functions similar to those of the software solution of FIG. 2A. The firmware may be embodied as an integrated circuit comprised in circuit board 140b. As used herein, an "integrated circuit" or IC means a semiconductor device and/or microelectronic device, such as, for example, a semiconductor integrated circuit chip that may provide computing resources. For example, the shelf manger 170b implemented in firmware may be located in the processor system 202 of the circuit board 140b. The shelf manager may also be located in a chipset controller 210. The chipset controller 210 may include a host bridge/hub system (not shown) that couples the processor system 202 to the chipset controller and/or other components of the circuit board. The chipset controller 210 may include one or more integrated circuit chips, such as those selected from integrated circuit chipsets commercially available from the Assignee of the subject application (e.g., controller embedded into a chipset, for example, a network interface controller and/or processor), although other integrated circuit chips may also, or alternatively be used.

A mezzanine card 216 may also be coupled to the circuit board 140b to expand the functionality of the circuit board, and the shelf manager 170b implemented in firmware may be located in the mezzanine card 216. The mezzanine card may be an Advanced Mezzanine Card as detailed in PICMG AMC.0, Advanced Mezzanine Card Short Form Specification, dated Jun. 15, 2004. Other types of mezzanine cards, for example, a PCI Mezzanine card and/or other type of Mezzanine card may also be utilized. The shelf manager 170b implemented in firmware may also be located in the IPMC 204.

The shelf manager 170 may comprise a predefined and/or user definable set of manageability functions. To that end, shelf manager 170 (as may be embodied as software 170a and/or firmware 170b) may be capable of implementing one or more manageability policies, as may be defined by a user, which may be operable to determine which components of the shelf may provide shelf management functionality in the system.

Shelf manager 170 (as software 170a and/or firmware 170b) may be capable of communicating with one or more ATCA circuit boards 140, 142, 144, 146, 148, 150, 152, shelf FRU devices 186, power entry module 180, fan trays 182, alarm board 184, and other FRUs. For example, the shelf manager 170 may discover one or more variables related to one or more components of the system 100 by utilizing the IMBP 160 to communicate with one or more components of the system.

FIG. 3 is a block diagram illustrating an exemplary architecture 300 of the shelf manager 170. As stated herein, shelf manager 170 may comprise firmware and/or software capable of performing one or more management functions. Layer 302 may include instructions capable interfacing the shelf manager 170 to an IPMC of that circuit board where the shelf manager 170 may be located. Interface 170 may also permit the shelf manager 170 to exchange IPMI messages between the shelf manager 170 and one or more components of the system, via the IMPB 160. Layer 302 may also provide a communication path for one or more IPMCs and/or other components, which may be operable to communicate IPMI requests and information to the shelf manager 170 for processing. Layer 302 may include a Universal Asynchronous Receiver/Transmitter (UART) type interface, block transfer (BT) interface, a KCS (keyboard controller style) interface, and/or other interface. The KCS interface driver has been developed as part of open source development, and integrated into carrier grade Linux distributions. The KCS interface driver may provide message transfers on a per user instance basis, perform response message tracking for IPMI Send Message requests, and forward appropriate responses to user instances of the driver.

A network enabled shelf management controller (ShMC) interface 304 may be capable of providing interface capability between the shelf manager 170 and one or more IPMBs of a different shelf or chassis. Interface 304 may be capable of exchanging data and information using a communications protocol that complies or is compatible with a Transmission Control Protocol (TCP) and/or Remote Management Control Protocol (RMCP) and/or other communication protocols. The communication protocol of the ShMC interface 304 may be independent of other communication protocols employed by the exemplary architecture 300.

A local area network (LAN) interface 306 may also be provided. LAN interface 306 may be capable of communicating IPMI messages over LAN communication protocols. For example, management clients can connect with the shelf manager 170 over a Remote Management Control Protocol (RMCP) session to send IPMI messages directed at the shelf manager 170 itself, or to be bridged over to the IPMB 160. For an RMCP defined session, the LAN interface 306 may perform all of the RMCP defined session management functionalities, discover messages that may be forwarded to shelf management layers capable of processing requests, and/or decide if the message needs to be bridged over to the IPMB 160.

Other specialized interfaces 308 may also be utilized. For example, since the shelf manager 170 may be deployed on different hardware-configurations (i.e., in different components of the system), one such configuration could be a dedicated shelf management configuration. In this case, the specialized interface 308 into the IMPB subsystem may be provided through a specific hardware driver that provides connectivity to the IPMB (regardless of whether it is radial or bused), and may also provide an interface to the Interface Abstraction Layer 310. This driver may provide the same functionality as provided by a KCS IPMI driver, for example, which may provide consistent functionality across multiple hardware interface drivers by abstracting out specifics of hardware interaction.

The interface abstraction layer 310 may provide a programming interface to the shelf manager 170 (regardless of the type of hardware or software interface coupled to the interface abstraction layer 310), and may exchange commands and data with one or more different interfaces 302, 304, 306, 308. The interface abstraction layer 310 may thus allows the shelf manager 170 to reside on any hardware, and may operate to abstract out the underlying hardware interface used to get access to IPMB and the IPMI controller. Hence, interface abstraction layer 310 may permit other functionalities of the shelf management architecture 300, while providing flexible interaction with different hardware interfaces to perform management functions. The interface abstraction layer 310 may also provide IPMI message formatting, message tracking, and response matching for requests.

The interface abstraction layer 310 may also perform additional functions, for example, determining if a request needs to be formatted as a local IPMI request to the IPMC or as a IPMI Send Message that needs to be bridged by the IPMC over to the IPMB. Interface layer 310 may also include application programming interfaces (APIs) to provide integration of a plurality of different hardware interfaces into the shelf manager 170. It should be noted that since the architecture 300 (FIG. 3) may provide a flexible and scalable framework, the same model can be extended to provide manageability functions for different hardware platforms.

The shelf management abstraction layer 312 may provide an interface layer for the instrumentation stack 314. The abstraction layer 312 may provide an abstraction through an Application programming interface (API) that may be capable of communicating with instrumentation stack 314, which can either reside on the same memory as the shelf management 170 or on a remote computing resource. This mechanism may permit, for example, relatively small bandwidth IPMC and/or mezzanine card and/or processor to provide a subset of shelf management functionality while the rest of the instrumentation resides on network management system. For example, in one embodiment, shelf management abstraction layer 312 shelf, shelf manager 170 and interface abstraction layer 310 may be embodied as software and/or firmware and comprised in the IPMC 204, while other layers in the architecture 300 may be comprised in another machine, system and/or component of shelf 102. The instrumentation stack 314 can provide health tracking of each circuit board, correlation of errors, and/or other capabilities. This shelf management abstraction layer 312 may provide a programming interface to the instrumentation stack 314. Having a programming interface at the layer 312 may allow the shelf manager 170 to reside on any hardware entity in communication with this interface 312. Thus, shelf manager 170 may interact with the instrumentation stack 314 regardless of where the shelf manager 170 resides. In one embodiment, the shelf manager 170 may be implemented on a circuit board such as an IXA blade, but the instrumentation stack resides on another circuit board. Alternatively, the shelf manger 170 may reside on a dedicated service processor on a blade and the instrumentation stack resides on the host processor of that blade. This flexible architecture allows implementation of modular building blocks for management solutions.

The instrumentation stack layer 314 may be capable of communicating with one or more interfaces such as a command line interface (CLI) 316, simple network management protocol (SNMP) interface 318, customer information model (CIM) interface 320, and hyper text transfer protocol (HTPP) and others 322. The instrumentation stack 314 may also provide a programming interface, and a proprietary interface may also be implemented therein that may be used in a particular operating environment and/or may be selectively enabled remotely as a service that may be purchased for a certain period of time.

Figure 4:
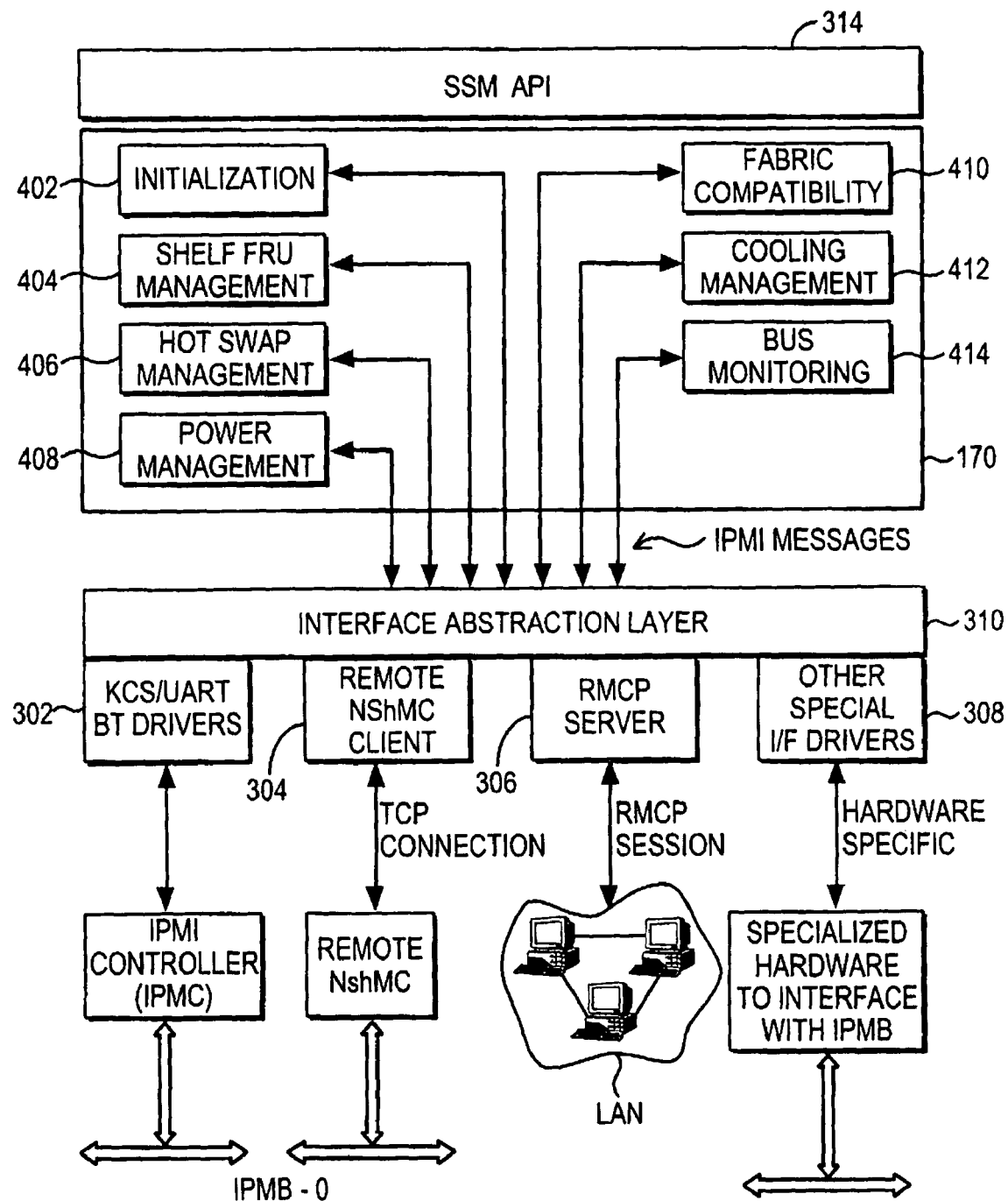
FIG. 4 is a block diagram illustrating exemplary functionality of the shelf manager of FIGS. 2A and 2B.

FIG. 4 is a block diagram of the architecture of FIG. 3 showing in more detail a plurality of manageability functions that may be performed by shelf manager 170. Exemplary manageability functions may include initialization 402, shelf FRU management 404, hot swap management 406, power management 408, fabric compatibility management 410, cooling management 412, and bus (IPMB) monitoring 414. To that end, and as will be described in greater detail below, shelf manager 170 may be capable of discovering one or more variables from one or more components of the shelf. "Variable" or "variables", as used in any embodiment herein may be defined as information. Like parts of FIG. 4 and FIG. 3 are labeled similarly, and hence any repetitive description of such components is omitted herein for clarity.

The initialization function 402 may enable the shelf manager 170 to discover one or more devices such as FRU devices. The shelf manager 170 may act as the single point of access for shelf FRU devices. Therefore, the shelf manager may save a copy of Shelf FRU data in memory, e.g., RAM, so that any requests into shelf manager 170 to read/write shelf FRU data can be completed with minimum delays. Shelf manager 170 may also be responsible to ensure consistencies of data between saved copies and data on Shelf FRU devices. To that end, initialization function 402 may compare saved copies of data and data from one or more Shelf FRU devices to determine if a match exists between this data. Functionality 402 may be provided in software and/or in firmware by the shelf manager 170.

An initialization process may be performed by IPMCs on circuit boards where the IPMC initialize themselves and read shelf FRU data or some other storage media locally on the shelf and/or receive commands from a network coupled to the IPMC (via a network interface). This operation may enable the IPMC to obtain policy data from an external source that indicates if the board is to perform shelf management. If the board is instructed, by way of policy data, to perform shelf management, the policy data may also indicate which component on the circuit board (processor, IPMC FW, mezzanine card) is to perform shelf management.

If the processor is designated to provide shelf management, the IPMC may be capable of proving instructing to one or more boards in the system 100 that may require remote access for the processor on the local board to access its operating system image and initialize its operating. This operation may be utilized if the processor on the circuit board requiring remote access to its operating and/or the mezzanine card is designated to provide shelf management. Once this initialization is completed, the entity that is designated to provide shelf management (as may be indicated in policy data setting), may begin shelf management functions to the components in the system. This procedure may permit, for example, circuit boards that boot off a network to get communicate with remote storage devices to obtain access to their operating system images from the network. Of course, communication with such remote storage devices may comply or be compatible with an Internet Protocol (IP) based communication protocol and/or other communication protocol.

The shelf FRU management function 404 may operate to obtain information about shelf FRU devices. Such shelf FRU devices may contain important information about the shelf, which may be used for power sequencing, power budgeting, addressing, and determining slot descriptions. Shelf FRU devices may be accessible over a backplane bus, for example a seperate IPMB. The shelf FRU management function 404 may scan for IPMI devices at known IPMB address ranges for ATCA using the GetDeviceID IPMI command or the BroadcastGetDeviceID command. On successful discovery of IPMI devices at particular address, a response to GetAddressInfo command indicates if the IPMI device provides shelf FRU information.

On discovery of first shelf FRU device, the shelf management function 404 may read information from this shelf FRU device. This information may include the shelf address which indicates the physical location of the shelf, which in turn may be used by applications executing on blades to enable, for example, location specific capabilities. This information may also include an address table that describes addressable devices in the shelf. For each of the addressable devices in the shelf, hardware address, site number, and site type information may be included. This information may also include a shelf power description record that describes the power distribution map within the shelf. This may be used to represent the number of power feeds available to the boards that are powered by individual power feeds, internal current levels, and operating voltages, which all may be used for power budgeting purposes.

Information discovered by the shelf FRU management function may also include a shelf activation and power management record that contains an array of activation and power descriptors for each blade in the chassis. Power descriptors describe the hardware address, FRU Device ID, maximum power that can be routed to the FRU and whether the shelf manager needs to activate the FRU or activation is left for a higher level entity. This information may be used for power sequencing, as part of the power management functionality 408. Additional information from the shelf FRU may include backplane point-to-point slot descriptor records that describe connectivity information for the chassis back plane, indicating which interfaces are connected from one slot to another. This information may be provided for base, fabric & update channel interfaces and may be used for Fabric compatibility management functions 410 (described below). This shelf FRU management functionality 404 may be provided entirely in software and/or in firmware by the shelf manager 170.

Hot swap management functionality 406 may also be provided by the shelf manager 170. Hot sway functionality may enable the shelf manager 170 to manage the hot swap process of one or more blades or boards in the ATCA chassis. Blades can be inserted into a chassis or requested for extraction at any point in time, which may include communication of these states between the blade and shelf manager 170 over the IPMB. The ATCA Specification defines hot swap state machine which may be used for state transitions and communicating the states between the shelf manager and the blades. This state machine governs the process of insertion, extraction, activation, de-activation, and surprise extraction of blades in ATCA chassis. This hot swap functionality 406 may be provided entirely in software and/or in firmware by the shelf manager 170.

Power management functionality 408 may also be provided by the shelf manager 170. Such power management functionality may include determining a total amount of power available to a plurality of components of a computer system, e.g., in the shelf, and monitoring power consumption of at least one of the plurality of components. The power management functionality may also include adjusting power consumption of at least one of the components, e.g., if the power consumption of that component increases total power consumption above budgeted or available levels.

For example, power management functionality 408 may include the ability of the shelf manager 170 to determine the power availability on the shelf, assign power budget to one or more blades and/or maintain the power budget assignment at the chassis level. Shelf FRU devices may provide all necessary information on the amount of feeds available on the chassis, total power available, number of feeds, and which FRUs are powered by which feeds. This information may be used along with the power information available from FRUs, to determine if there is enough power available in the chassis and the feed that the FRU is connected to, so as to enable payload power to the FRU. This management functionality 408 may be provided entirely in software and/or in firmware by the shelf manager 170.

Fabric compatibility management 410 may also be provided by the shelf manager 170. Fabric compatibility management 410 may determine signaling compatibility between circuit boards that provides interfaces to slots in the back plane to which they are inserted. This may include determining the signaling type of interfaces of various circuit boards, and enabling the circuit boards to communicate if the circuit boards have compatible signaling types.

Fabric compatibility management may replace mechanical keying used on legacy architectures. Since ATCA is an open modular architecture, boards from one or more vendors can be inserted into a chassis. These boards may provide different types of interfaces to the back plane (Ethernet, Infiniband, Fiber channel, PCI Express—Advanced Switching, Rapid IO, etc). The back plane may provide interconnectivity between different boards in the chassis. Fabric compatibility management functionality 410 may determine if interfaces of two boards that are interconnected through the back plane have similar signaling types, so that those interfaces can be enabled by the boards and communicate over the back plane. ATCA architecture may have multiple interfaces on the back plane. Bused resources like metallic test buses and synchronization clocks may be bused across the back plane and may be electronically keyed using a slightly different model, as described in Section 3.7.3 of the ATCA Specification. All such fabric compatibility management functionality 410 may be provided entirely in software and/or in firmware by the shelf manager 170.

Cooling management 412 may also be provided by the shelf manager 170. Such cooling management 412 functionality enables the shelf manager 170 to provide adequate cooling in the chassis. Such cooling management 412 may generally include monitoring a thermal condition of each of a plurality of components in the shelf, and adjusting a cooling device, e.g., a fan of the fan tray 182, in response to a thermal condition in excess of a thermal threshold level. For example, under normal operating conditions, every board (FRU) may send thermal condition information to the shelf manager 170. The cooling management 412 functionality of shelf manager 170 may take action to increase cooling to the chassis by sending IPMI commands to fan tray 182 to increase fan speeds in response to a thermal condition in excess of a thermal threshold level. When the thermal condition subsides as indicated by a temperature less than the thermal threshold level, the cooling management 412 functionality may instruct the fan tray 182 to reduce speeds to normal levels. Such cooling management functionality 412 may be provided entirely in software and/or in firmware by the shelf manager 170.

Bus (IPMB) monitoring functionality 414 may also be provided by the shelf manager 170. Generally, bus monitoring 414 may include monitoring a condition of an associated bus, e.g., the IPMB 160. Bus monitoring 416 may be utilized to determine if the IPMB is functioning normally. Referring again to the IPMB 160 of FIG. 1, and only as an example, the back plane IPMB 160 may be divided into two segments. The first segment may be the part of IPMB coming out of the IPMC to the point where it enters the back plane. The end point for this segment may be IPMB isolators on the board and may be called the board side IPMB. The second segment may be the back plane side IPMB or the IPMB on the entire back plane. As per the ATCA Specification, each IPMC on each board may be capable of determining the integrity of IPMB on the board side of the IPMB, while the shelf manager 170 may be capable of maintaining the integrity of IPMB on the back plane side as well. As such, shelf manager 170 may use functionality provided by IPMC to execute one or more commands that determines the integrity of the IPMB on the back plane side. Such bus (IPMB) monitoring functionality 414 may be provided entirely in software and/or in firmware by the shelf manager 170.

Shelf management 170 as described in any embodiment herein including all or a subset of the shelf management functions may replicated anywhere in the system to provide for redundant shelf management. Redundancy may be implemented by having a second shelf manager 170 that executes as standby, or multiple copies that collectively decide which one of them would perform as "active" or "master" to perform shelf management functionality. Since shelf management functionality, as described herein may reside anywhere in the system, and thus, no dedicated hardware signals are required between the copies of shelf management that constitute redundancy. In other words, redundancy may be implemented without any direct hardware interconnects between the instances of shelf managers that provide shelf management.

Additionally, shelf manager 170 may be integrated into one or more chipsets of shelf 102 (and/or one or more chipsets of one or more circuit cards populated on shelf 102). For example, it is fully contemplated herein that shelf manager embodied as software and/or firmware may be integrated into a network controller and/or communication interface controller that may be included in one or more circuit cards and/or shelf (or both). Alternatively or additionally, shelf manager 170 may be integrated into a chipset associated comprised in computer system (not shown) in communication with shelf 102 without departing from this embodiment.

FIG. 5 depicts a flowchart 500 of exemplary operations which may be performed according to an embodiment. Operations may include discovering, by a shelf manager embodied as firmware and/or software, at least one variable from at least one component populated on a shelf system 502. Operations may also include performing, by a shelf manager embodied as firmware and/or software, at least one shelf management function based on at least one variable 504.

Thus, in summary, one embodiment may comprise an article. The article may include a machine readable medium having stored thereon instructions that when executed by a machine result in the machine performing operations that may include discovering one or more variables from one or more components populated on a shelf system. Other operations may include performing one or more shelf management operations based on one or more variables.

At least one apparatus embodiment provided herein may include an integrated circuit comprising firmware, the firmware is capable of performing operations that may include discovering one or more variables from one or more components populated on a shelf system. Other operations may include performing one or more shelf management operations based on one or more variables.

A system embodiment may comprise a bus and a circuit board coupled to the bus. The circuit board may comprise an integrated circuit. The integrated circuit may comprise firmware and/or software capable of performing operations that may include discovering one or more variables from one or more components populated on a shelf system and performing one or more shelf management operations based on one or more variables.

Exemplary manageability operations may comprise determining a total amount of power available to plurality of components of a computer system, and monitoring power consumption of at least one of the plurality of components.

Advantageously, in these embodiments, manageability functions that were conventionally provided only by hardware components may now be provided in software and/or firmware by the shelf manager 170. As such, the shelf manager 170 provides for flexibility compared to conventional hardware solutions since the shelf manager 170 is not tied to any particular shelf or chassis. The flexibility of the shelf manager 170 to be readily implemented into different environments also saves money on implementation costs that may otherwise occur when hardware only solutions for one particular system need to be reengineered for other systems.

The shelf manager 170 implemented in software and/or firmware may also saves space in an environment where there is a premium on such space. For example, the shelf manger 170 may be readily integrated into base stations, node-b, and other edge segments, where footprint requirements may severely limit any hardware solutions.

The shelf manager 170 described herein may also consumes significantly less power than conventional hardware solutions. This enables power to be saved increasing power efficiency or enables the power saved to be provided to other components. For example, the processor system on the blade (dual Xeon processors, available from the Assignee of the subject application, in one embodiment) may benefit from or require additional power consumption.

The flexible architecture of the shelf manager 170 implement in software and/or firmware may enable the shelf manger 170 to be location independent. The shelf manger 170 may also communicate with a plurality of devices through a plurality of different interfaces. Shelf manager 170 may also comprise one or more abstraction layers which may be capable of providing a consistent programming interface to the shelf manager 170.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. An article comprising:
a machine readable medium having stored thereon instructions that when executed by a machine result in the machine performing operations comprising:
discovering, via a shelf manager included within said machine readable medium of at least one component of a plurality of components populated on a shelf system, at least one variable from any one of said plurality of components populated on said shelf system, said shelf manager including an interface abstraction layer configured to provide a programming interface to said shelf manager and to exchange at least one command with at least one additional interface, said shelf manager further including a shelf management abstraction layer configured to provide an interface layer for an instrumentation stack; and
performing, via said shelf manager, at least one shelf management function based on said at least one variable, said at least one shelf management function comprising:
determining signaling types of an interface associated with each of said plurality of components;
enabling said plurality of circuit boards to communicate with one another;
determining a total amount of power available to a plurality of said components of said shelf system; and
monitoring power consumption of at least one of said components;
wherein said shelf manager is location independent within said shelf system;
wherein said at least one component is configured to perform another function independent of said shelf manager; and
wherein said shelf manager is integrated into said at least one component such that said shelf manager utilizes a component slot of said shelf system associated with said at least one component.

2. The article of claim 1, wherein said shelf management function further comprises:
adjusting power consumption of said least one component.

3. The article of claim 1, wherein said shelf management function further comprises:
monitoring a thermal condition of at least one said component; and
adjusting a cooling device in response to a thermal condition of at least one said component in excess of a thermal threshold level.

4. The article of claim 1, wherein at least one said component is coupled to a bus, and said shelf management function further comprises monitoring a condition of said bus.

5. An apparatus, comprising:
an integrated circuit, said integrated circuit comprising firmware, said firmware capable of performing operations comprising:
discovering, via a shelf manager included within said firmware of at least one component of a plurality of components populated on a shelf system, at least one variable from any one of said plurality of components populated on said shelf system, said shelf manager including an interface abstraction layer configured to provide a programming interface to said shelf manager and to exchange at least one command with at least one additional interface, said shelf manager further including a shelf management abstraction layer configured to provide an interface layer for an instrumentation stack; and
performing, via a shelf manager, at least one shelf management function based on said at least one variable, said at least one shelf management function comprising:
determining signaling types of an interface associated with each of said plurality of components;
enabling said plurality of circuit boards to communicate with one another;
determining a total amount of power available to at least one said component of said shelf system; and
monitoring power consumption of at least one said component;
wherein said shelf manager is location independent within said shelf system;
wherein said at least one component is configured to perform another function independent of said shelf manager; and wherein said shelf manager is integrated into said at least one component such that said shelf manager utilizes a component slot of said shelf system associated with said at least one component.

6. The apparatus of claim 5, wherein said shelf management function further comprises:
adjusting power consumption of at least one said component.

7. The apparatus of claim 5, wherein said shelf management function further comprises:
monitoring a thermal condition of at least one said component; and
adjusting a cooling device in response to a thermal condition of at least one said component in excess of a thermal threshold level.

8. The apparatus of claim 5, wherein at least one said component is couple to a bus, and said shelf management function further comprises monitoring a condition of said bus.

9. The apparatus of claim 5, wherein:
said integrated circuit comprising an intelligent platform management controller (IPMC).

10. The apparatus of claim 5, wherein:
said integrated circuit comprising a chipset controller.

11. A system comprising:
a bus;
a circuit board coupled to said bus, said circuit board comprising:
an integrated circuit, said integrated circuit comprising firmware, said firmware configured to perform operations comprising: discovering, via a shelf manager included within said firmware of at least one component of a plurality of components populated on a shelf system, at least one variable from any one of said plurality of components populated on said shelf system and performing at least one shelf management function based on at least one said variable, said shelf manager including an interface abstraction layer configured to provide a programming interface to said shelf manager and to exchange at least one command with at least one additional interface, said shelf manager further including a shelf management abstraction layer configured to provide an interface layer for an instrumentation stack, said at least one shelf management function comprising:
determining signaling types of an interface associated with each of said plurality of components;
enabling said plurality of circuit boards to communicate with one another;
determining a total amount of power available to at least one said component of said shelf system; and
monitoring power consumption of at least one said component;
wherein said shelf manager is location independent within said shelf system;
wherein said at least one component is configured to perform another function independent of said shelf manager; and
wherein said shelf manager is integrated into said at least one component such that said shelf manager utilizes a component slot of said shelf system associated with said at least one component.

12. The system of claim 11, wherein said shelf management function further comprises adjusting power consumption of said least one said component.

13. The system of claim 11, wherein said shelf management function further comprises:
monitoring a thermal condition of at least one said component; and
adjusting a cooling device in response to a thermal condition of at least one said component in excess of a thermal threshold level.

14. The system of claim 11, wherein at least one said component is coupled to a bus, and said shelf management function further comprises monitoring a condition of said bus.

15. The system of claim 11, wherein:
said integrated circuit comprising an intelligent platform management controller (IPMC).

16. The system of claim 11, wherein:
said integrated circuit comprising a chipset controller.

17. A system comprising:
a bus;
a circuit board coupled to said bus, said circuit board comprising:
an integrated circuit, said integrated circuit comprising a machine readable medium having stored thereon instructions that when executed by integrated circuit result in said integrated circuit performing operations comprising discovering, via a shelf manager included within said machine readable medium of at least one component of a plurality of components populated on a shelf system, at least one variable from any one of said plurality of components populated on said shelf system and performing at least one shelf management function based on at least one said variable, said shelf manager including an interface abstraction layer configured to provide a programming interface to said shelf manager and to exchange at least one command with at least one additional interface, said shelf manager further including a shelf management abstraction layer configured to provide an interface layer for an instrumentation stack, said at least one shelf management function comprising:
determining signaling types of an interface associated with each of said plurality of components;
enabling said plurality of circuit boards to communicate with one another;
determining a total amount of power available to at least one said component of said shelf system; and
monitoring power consumption of at least one said component;
wherein said shelf manager is location independent within said shelf system;
wherein said at least one component is configured to perform another function independent of said shelf manager; and
wherein said shelf manager is integrated into said at least one component such that said shelf manager utilizes a component slot of said shelf system associated with said at least one component.

18. The system of claim 17, wherein said shelf management function further comprises adjusting power consumption of said least one said component.

19. The system of claim 17, wherein said shelf management function further comprises:
monitoring a thermal condition of at least one said component; and
adjusting a cooling device in response to a thermal condition of at least one said component in excess of a thermal threshold level.

20. The system of claim 17, wherein at least one said component is couple to a bus, and said shelf management function further comprises monitoring a condition of said bus.

21. The system of claim 17, wherein:
said integrated circuit comprising an intelligent platform management controller (IPMC).

22. The system of claim 17, wherein:
said integrated circuit comprising a chipset controller.

23. A method, comprising:
discovering, via a shelf manager included within at least one component of a plurality of components populated on a shelf system, at least one variable from any one of said plurality of components populated on said shelf system, said shelf manager including an interface abstraction layer configured to provide a programming interface to said shelf manager and to exchange at least one command with at least one additional interface, said shelf manager further including a shelf management abstraction layer configured to provide an interface layer for an instrumentation stack; and performing, via said shelf manager included within said at least one component populated on said shelf system, at least one shelf management function based on at least one said variable, said at least one shelf management function comprising:
  determining signaling types of an interface associated with each of said plurality of components;
  enabling said plurality of circuit boards to communicate with one another;
  determining a total amount of power available to at least one said component of said shelf system; and
  monitoring power consumption of at least one said component;
  wherein said shelf manager is location independent within said shelf system;
  wherein said at least one component is configured to perform another function independent of said shelf manager; and
  wherein said shelf manager is integrated into said at least one component such that said shelf manager utilizes a component slot of said shelf system associated with said at least one component.

24. The method of claim 23, further comprising:
adjusting, by said shelf manager, power consumption of said least one component.

25. The method of claim 23, further comprising:
monitoring, by said shelf manager, a thermal condition of at least one said component and adjusting, by said software, a cooling device in response to a thermal condition of said at least one component in excess of a thermal threshold level.

26. The method of claim 23, wherein at least one said component is coupled to a bus, and said method further comprising monitoring, by said shelf manager, a condition of said bus.

* * * * *